(12) United States Patent
Hong (10) Patent No.: US 8,686,446 B2
(45) Date of Patent: Apr. 1, 2014

(54) CAPACITOR DEVICE AND DISPLAY APPARATUS HAVING THE SAME

(75) Inventor: Sang-Min Hong, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 317 days.

(21) Appl. No.: 13/221,184

(22) Filed: Aug. 30, 2011

(65) Prior Publication Data

US 2012/0175649 A1    Jul. 12, 2012

(30) Foreign Application Priority Data

Jan. 12, 2011   (KR) .................. 10-2011-0003154

(51) Int. Cl.
    *H01L 33/00*        (2010.01)
(52) U.S. Cl.
    USPC ...... 257/89; 257/532; 257/533; 257/E33.053; 257/E51.025; 257/E27.089; 349/38; 349/39; 349/139; 361/301.1; 438/190

(58) Field of Classification Search
    None
    See application file for complete search history.

(56) References Cited

U.S. PATENT DOCUMENTS 6,069,050 A * 5/2000 Hou et al. ............... 438/393
2010/0155734 A1 6/2010 Lee et al.

FOREIGN PATENT DOCUMENTS

| KR | 10-2003-0035219 | 5/2003 |
| KR | 10-2008-0027568 | 3/2008 |
| KR | 10-2008-0062545 | 7/2008 |
| KR | 10-2010-0075276 | 7/2010 |

* cited by examiner

*Primary Examiner* — Yasser A Abdelaziez
(74) *Attorney, Agent, or Firm* — Robert E. Bushnell, Esq.

(57) ABSTRACT

A capacitor device prevents capacitor failure and pixel failure by preventing the capacitor from experiencing a short circuit caused by disconnection of a bridge formed between electrodes of the capacitor and a display apparatus having the capacitor device. A display device comprises a thin film transistor, a light emitting device, and the capacitor device described above.

21 Claims, 6 Drawing Sheets

CAPACITOR DEVICE AND DISPLAY APPARATUS HAVING THE SAME

CLAIM OF PRIORITY

This application makes reference to, incorporates the same herein, and claims all benefits accruing under 35 U.S.C. §119 from an application earlier filed in the Korean Intellectual Property Office on 12 Jan. 2011 and there duly assigned Serial No. 10-2011-0003154.

BACKGROUND OF THE INVENTION

1. Field of the Invention

The present invention generally relates to a capacitor device and a display apparatus having the same. The capacitor device prevents capacitor failure and pixel failure by preventing the capacitor from experiencing a short circuit caused by disconnection of a bridge formed between electrodes of the capacitor and a display apparatus having the capacitor device.

2. Description of the Related Art

Flat panel display apparatuses, such as organic light emitting display apparatuses and liquid crystal display apparatuses, display images by applying a scanning signal and a data signal to a device unit which includes a plurality of thin film transistors and capacitors through a scan line and a data line, respectively, and by transmitting the signals applied to the device unit to a light emitting device which is electrically connected to the device unit.

SUMMARY OF THE INVENTION

One or more embodiments of the present invention provides a capacitor device which can prevent capacitor failure and dark spot formation, and a display apparatus having the capacitor device.

According to an aspect of the present invention, a capacitor device comprises: a first electrode including a first region and a second region, each having an area separated from each other, and a first bridge disposed between the first region and the second region, and which electrically connects the first region and the second region; a second electrode including a third region and a fourth region, each having an area separated from an area of the other, and a second bridge disposed between the third region and the fourth region, and which electrically connect the third region and the fourth region; a dielectric film formed between the first electrode and the second electrode; a first insulating film covering the first electrode; a first opening formed in the first insulating film so as to open the first bridge; and a second opening formed in the first insulating film and the dielectric film so as to open the second bridge.

The third region and the fourth region may be disposed on regions corresponding to the first region and the second region, respectively.

The first bridge may not be formed so as to correspond to the second bridge.

The first bridge may connect the first region and the second region by crossing a region by means of which the first region and the second region are separated.

The first bridge may be formed on the same layer as the first region and the second region.

The second bridge may connect the third region and the fourth region by crossing a region by means of which the third region and the fourth region are separated.

The second bridge may be formed on the same layer as the third region and the fourth region.

The first bridge may connect the first region and the second region by avoiding the region by means of which the first region and the second region are separated.

The second bridge may connect the third region and the fourth region by avoiding the region by means of which the third region and the fourth region are separated.

According to an aspect of the present invention, a display apparatus comprises at least one thin film transistor (TFT), a capacitor, and a light emitting device, wherein the TFT includes a semiconductor layer, a gate electrode, and source and drain electrodes. The capacitor comprises: a first electrode which includes a first region and a second region, each having an area separated from an area of the other; and a first bridge disposed between the first region and the second region, and which electrically connects the first region and the second region; a first wire unit connected to the first electrode; a second electrode which includes a third region and a fourth region, each having an area separated from an area of the other, and a second bridge disposed between the third region and the fourth region, and which electrically connect the third region and the fourth region; a second wire unit connected to the second electrode; a dielectric film formed between the first electrode and the second electrode; and a first insulating film covering the first electrode. The light emitting device comprises a pixel electrode connected to one of the source and drain electrodes, a facing electrode facing the pixel electrode, and a light emitting layer disposed between the pixel electrode and the facing electrode, wherein the light emitting device is disposed on the capacitor so as to correspond to the capacitor. The capacitor further comprises: a first opening in the first insulating film to expose the first bridge; and a second opening in the first insulating film and the dielectric film to expose the second bridge.

The first electrode may be formed on the same layer as, and of the same material used to form, the semiconductor layer, the gate electrode, or the source and drain electrodes. The second electrode may be formed on the same layer as, and of the same material used to form, the semiconductor layer, the gate electrode, or the source and drain electrodes which is not formed with the first electrode.

The first wire unit may be connected to a power voltage supply line of the display apparatus, and the second wire unit may be connected to the source or drain electrodes of the TFT.

The first wire unit may be connected to the first region or the second region, and the power voltage supply line may be disposed so as to overlap the first region or the second region.

The third region and the fourth region may be respectively disposed on regions corresponding to the first region and the second region.

The first bridge and the second bridge may not be disposed so as to correspond to each other.

The first bridge may connect the first region and the second region by crossing a region by means of which the first region and the second region are separated.

The first bridge may be formed on the same layer as the first region and the second region.

The second bridge may connect the third region and the fourth region by crossing the region by means of which the third region and the fourth region are separated.

The second bridge may be formed on the same layer as the third region and the fourth region.

The first bridge may connect the first region and the second region by avoiding the region by means of which the first region and the second region are separated.

The second bridge may connect the third region and the fourth region by avoiding the region by means of which the third region and the fourth region are separated.

By means of the capacitor device and the display apparatus having the capacitor device according to the present invention, capacitor failure and pixel failure can be prevented by preventing disconnection of a bridge formed between electrodes of the capacitor.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

The present invention will now be described more fully with reference to the accompanying drawings in which exemplary embodiments of the invention are shown.

A capacitor included in a display apparatus comprises first and second electrodes and an insulating layer which functions as a dielectric film between the first and second electrodes. However, when the dielectric film is damaged by a contaminant, such as particles, during manufacturing of the dielectric film, a short circuit may occur between the first and second electrodes, and thus, the entire capacitor may be damaged. Damage of the capacitor causes dark spots and pixel failure of the display apparatus.

Figure 1:
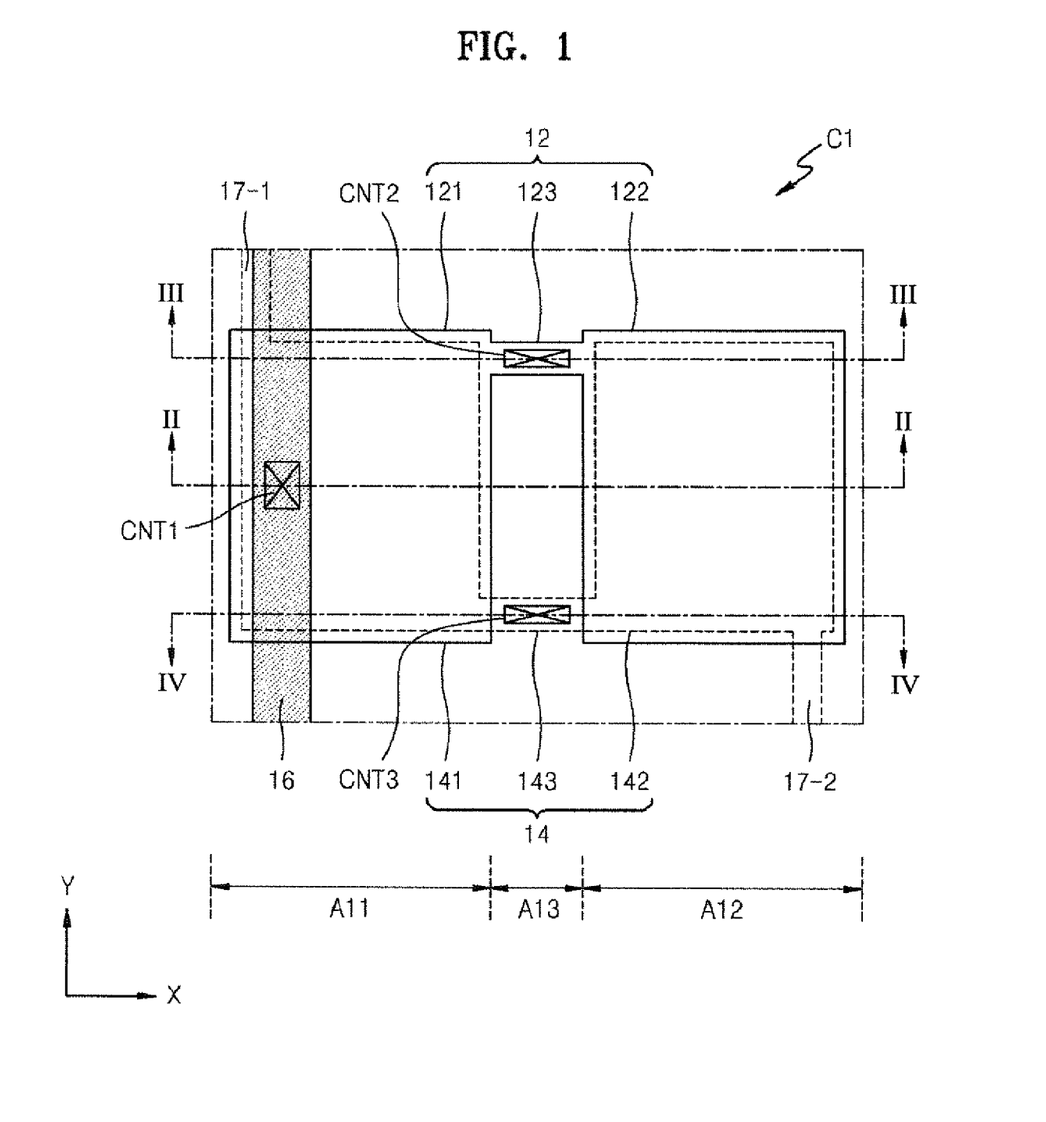
FIG. 1 is a schematic plan view of a capacitor device according to an embodiment of the present invention.
Figure 2:
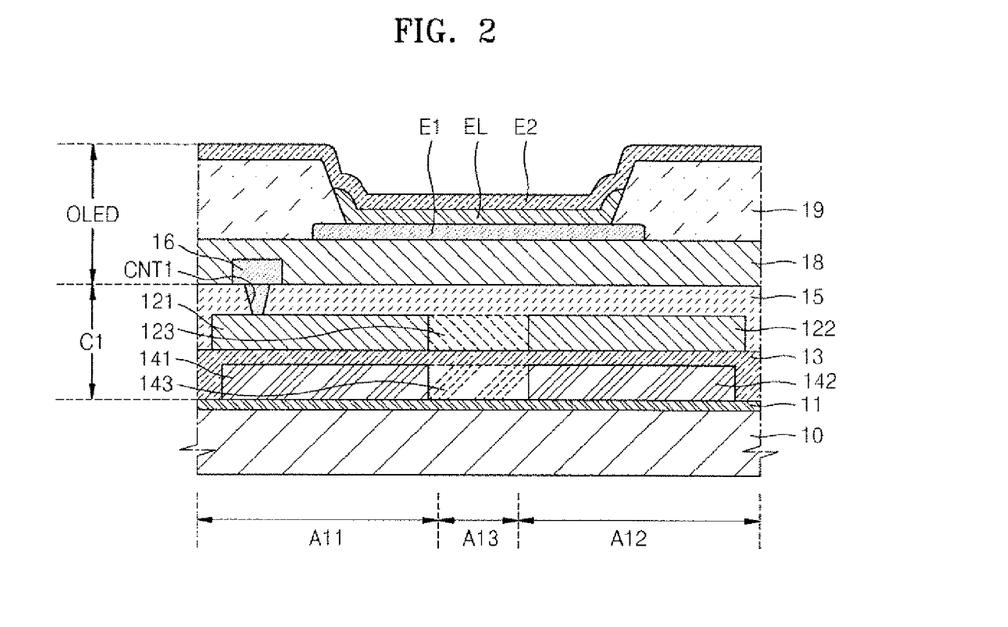
FIG. 2 is a cross-sectional view taken along line II-II of FIG. 1.
Figure 3:
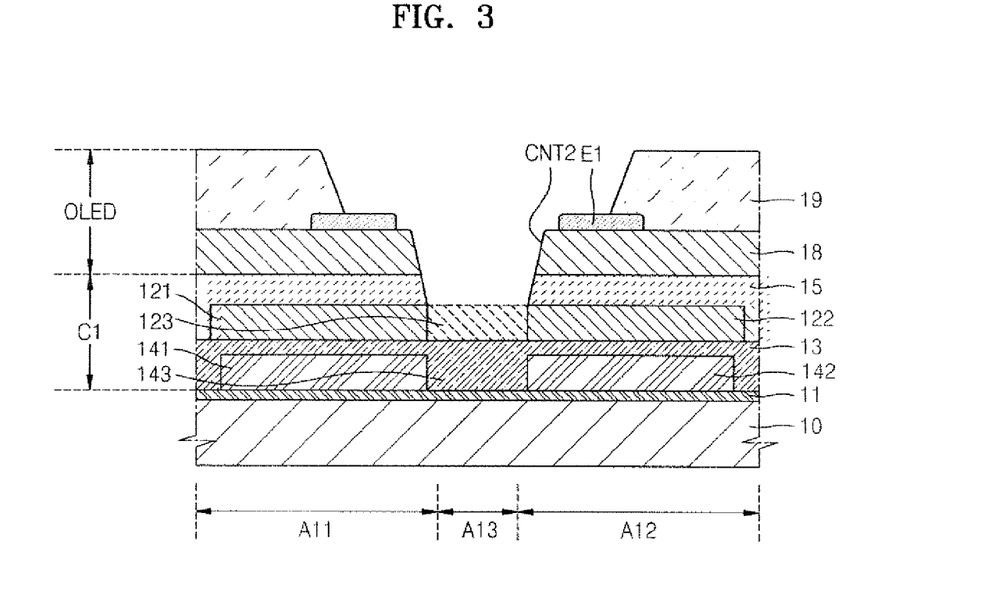
FIG. 3 is a cross-sectional view taken along line III-III of FIG. 1.

FIG. 1 is a schematic plan view of a capacitor device according to an embodiment of the present invention; FIG. 2 is a cross-sectional view taken along line II-II of FIG. 1; FIG. 3 is a cross-sectional view taken along line III-III of FIG. 1; and FIG. 4 is a cross-sectional view taken along line IV-IV of FIG. 1.

Figure 4:
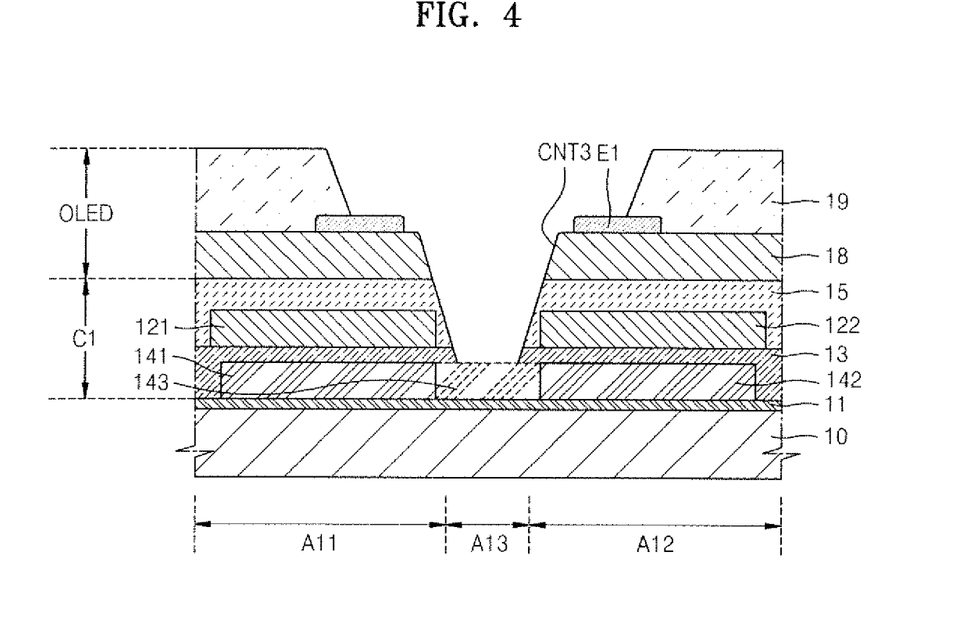
FIG. 4 is a cross-sectional view taken along line IV-IV of FIG. 1.

In particular, FIGS. 2 thru 4 are cross-sectional views of an organic light emitting device (OLED) disposed on a capacitor device C1.

Referring to FIGS. 1 thru 4, the capacitor device C1 according to an embodiment of the present invention includes a substrate 10 (FIG. 2), a first electrode 12 and a second electrode 14 disposed so as to face each other on a buffer layer 11 (FIGS. 1 and 2), and a dielectric film 13 disposed between the first and second electrodes 12 and 14, respectively (FIG. 2). An OLED may be disposed on the capacitor device C1.

The first electrode 12 includes a first region 121 and a second region 122 which are formed on the same layer and which are separated from each other, and a first bridge 123 which electrically connects the first and second regions 121 and 122, respectively, and which is disposed between the first and second regions 121 and 122, respectively (FIGS. 1 and 2).

Also, the second electrode 14 includes a third region 141 and a fourth region 142 which are formed on the same layer and which are separated from each other, and a second bridge 143 which electrically connects the third and fourth regions 141 and 142, respectively, and which is disposed between the third and fourth regions 141 and 142, respectively (FIGS. 1 and 2). The third and fourth regions 141 and 142, respectively, are disposed so as to correspond to the first and second regions 121 and 122, respectively.

In FIG. 1, the first bridge 123 and the second bridge 143 are depicted in a straight line shape. However, this is just an example, and the present invention is not limited thereto. That is, the first bridge 123 and the second bridge 143 may have any shape which can electrically connect the first and second regions 121 and 122, respectively, and which can be disposed between the third and fourth regions 141 and 142, respectively.

The first bridge 123 and the second bridge 143 are not disposed so as to correspond to each other. That is, as shown in FIG. 1, the second bridge 143 is not disposed so as to correspond to a lower direction of the first bridge 123. As shown in FIG. 1, the first bridge 123 electrically connects the first and second regions 121 and 122, respectively, on an upper edge of the first and second regions 121 and 122, respectively, and the second bridge 143 electrically connects the third and fourth regions 141 and 142, respectively, on a lower edge of the third and fourth regions 141 and 142, respectively. The first bridge 123 and the second bridge 143 may be disposed on an edge of the OLED.

The first bridge 123 may connect the first and second regions 121 and 122, respectively, across a third portion A13 which separates the first and second regions 121 and 122, respectively. Also, the second bridge 143 may connect the third and fourth regions 141 and 142, respectively, across the third portion A13 which separates the third and fourth regions 141 and 142, respectively.

A portion of the first bridge 123 is exposed through a first opening CNT2, and a portion of the second bridge 143 is exposed through a second opening CNT3. In particular, as shown in FIG. 3, the first opening CNT2 may be formed in a first insulating film 15, a second insulating film 18, and a pixel electrode E1 so as to expose the first bridge 123. Also, as shown in FIG. 4, the second opening CNT3 may be formed in a first insulating film 15, a second insulating film 18, and a pixel electrode E1 so as to expose the second bridge 143.

A first wire unit 16 is connected to the first electrode 12, and second wire units 17-1 and 17-2 are connected to the second electrode 14 (see FIGS. 1 and 2). The first wire unit 16 is formed on the insulating film 15, is connected to the first region 121 of the first electrode 12 through a first contact hole CNT1, and is disposed on a location overlapping the first region 121.

If a contaminant, such as particles, damages the dielectric film 13 during manufacturing of the capacitor device C1 on the substrate 10, a short circuit may occur between the first and second electrodes 12 and 14, respectively. In the case of an ordinary capacitor device, the entire capacitor device may be damaged.

However, in the capacitor device C1 according to the current embodiment, if particles damage a second portion A12 of the dielectric film 13 where the second and fourth regions 122 and 142, respectively, to which the first wire unit 16 is not connected, are located, the damage of the entire capacitor device C1 can be avoided by floating the second and fourth regions 122 and 142, respectively, by cutting the first bridge 123 and the second bridge 143, or by floating only the second region 122 by cutting the first bridge 123. That is, although an overall area is reduced, the function of the capacitor can be maintained with a first portion A11 where the first and third regions 121 and 141, respectively, are located, thereby preventing damage of the entire capacitor device C1.

Also, since the first insulating film 15 and the second insulating film 18 are not formed on the first bridge 123, but the first opening CNT2 is formed on the first bridge 123, when the first bridge 123 is cut from a lower surface of the substrate 10 using a laser, the cut first bridge 123 is located in the first opening CNT2. When the first insulating film 15 and the second insulating film 18 are formed on the first bridge 123, not only the first insulating film 15 and the second insulating film 18, but also the OLED, may be damaged by the cut first bridge 123. However, in the current embodiment, the first opening CNT2 is disposed on the first bridge 123, and thus, the cut first bridge 123 is located in the first opening CNT2. Therefore, damage to the OLED can be avoided when the first bridge 123 is cut.

Therefore, since the dielectric film 13, the first insulating film 15 and the second insulating film 18 are not formed on the second bridge 143, and the second opening CNT3 is formed on the second bridge 143, when the second bridge 143 is cut using a laser from the lower surface of the substrate 10, the cut second bridge 143 is located in the second opening CNT3. Therefore, OLED damage which could otherwise occur when the second bridge 143 is cut can be avoided.

Figure 5:
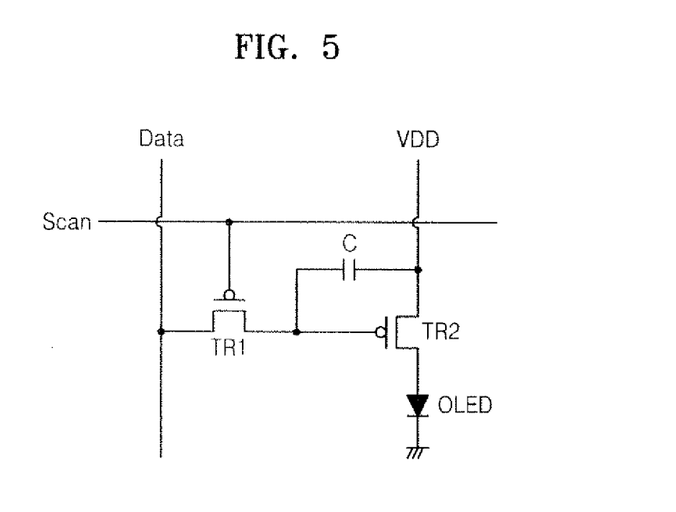
FIG. 5 is a pixel circuit of an organic light emitting display apparatus having a capacitor device according to an embodiment of the present invention.
Figure 6:
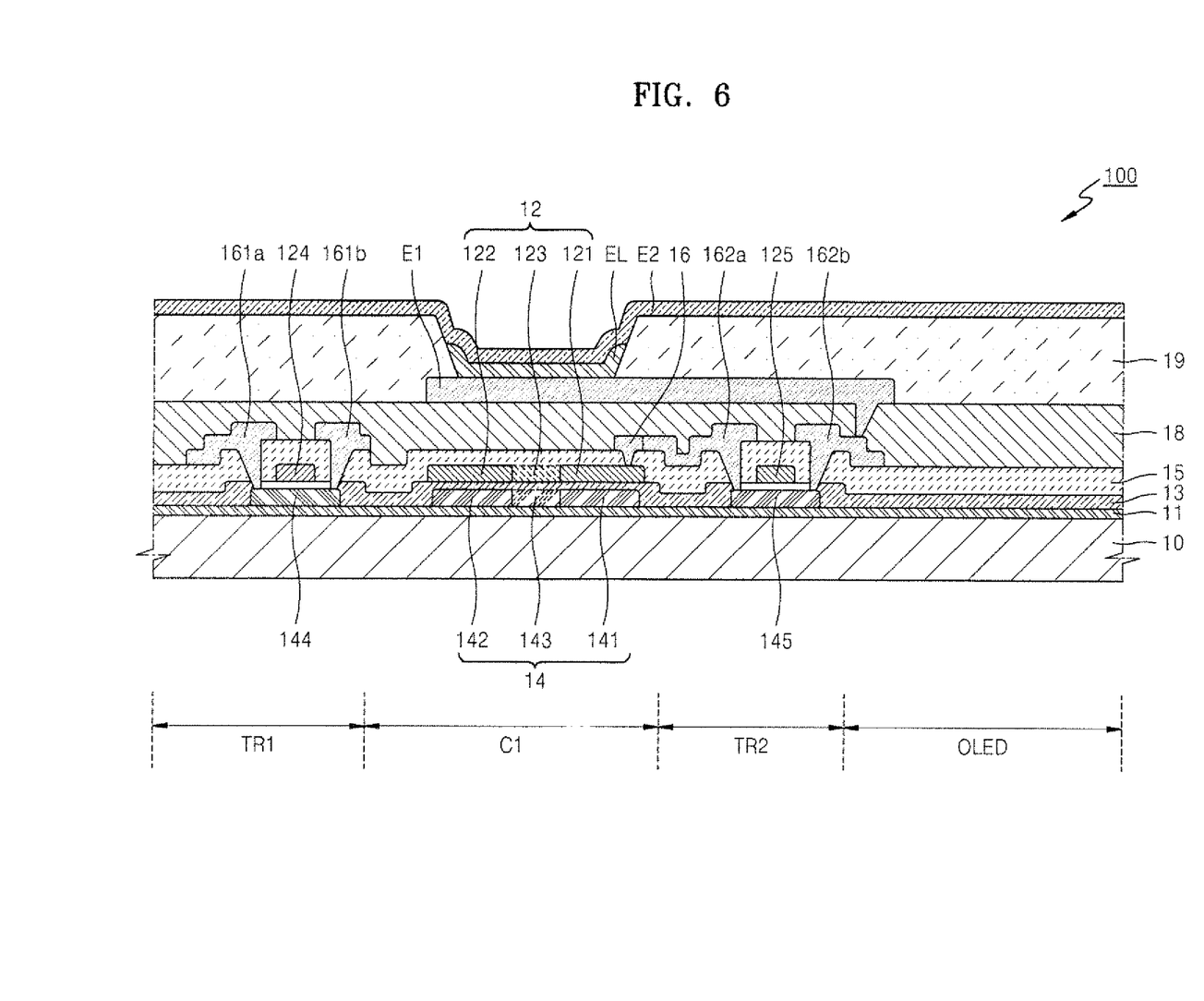
FIG. 6 is a schematic cross-sectional view of an organic light emitting display apparatus having a capacitor device according to an embodiment of the present invention.

FIG. 5 is a pixel circuit of an organic light emitting display apparatus having a capacitor device according to an embodiment of the present invention; and FIG. 6 is a schematic cross-sectional view of an organic light emitting display apparatus having a capacitor device according to an embodiment of the present invention.

Referring to FIGS. 5 and 6, a pixel of an organic light emitting display apparatus 100, which includes a capacitor device C1 according to an embodiment of the present invention, comprises: a plurality of conductive lines such as a scan line Scan, a data line Data, and a power voltage supply line VDD; an OLED which includes a light emitting region EL; first and second thin film transistors (TFTs) TR1 and TR2, respectively; and a capacitor C. However, the present invention is not limited to that arrangement, and numbers of the capacitor C and the TFTs shown in FIGS. 5 and 6 (that is, at least two TFTs and capacitors C) may be arranged in various combinations according to the pixel circuit.

A gate electrode 124 of the first TFT TR1 is connected to the scan line Scan, and a source electrode 161a of the first TFT TR1 is connected to the data line Data. A gate electrode 125 of the second TFT TR2 is connected to a drain electrode 161b of the first TFT TR1, a source electrode 162a of the second TFT TR2 is connected to the power voltage supply line VDD, and a drain electrode 162b is connected to an anode E1 of the OLED. The first TFT TR1 is a switching transistor, and the second TFT TR2 is a driving transistor. In FIG. 3, the first TFT TR1 and the second TFT TR2 are depicted as p-type transistors. However, the present invention is not limited thereto, and at least one of the first TFT TR1 and the second TFT TR2 may be an n-type transistor.

The capacitor C is connected between the drain electrode 161b of the first TFT TR1 and the power voltage supply line VDD 16. The first electrode 12 of the capacitor C includes the first and second regions 121 and 122, respectively, electrically connected to each other by the first bridge 123, and the second electrode 14 of the capacitor C includes the third and fourth regions 141 and 142, respectively, electrically connected to each other by the second bridge 143.

The first electrode 12 is formed on the same layer and of the same material used to form the gate electrodes 124 and 125 of the first TFT TR1 and the second TFT TR2, respectively. The second electrode 14 is formed on the same layer as, and of the same material used to form, the gate electrode 124 and 125 of the first TFT TR1 and the second TFT TR2, respectively. The first wire unit 16, which is the power voltage supply line VDD, is formed on the first insulating film 15. The first wire unit 16 is connected to the first region 121 of the first electrode 12 through the first contact hole CNT1, and is disposed at a location where the first wire unit 16 overlaps the first region 121.

The capacitor C functions as a storage capacitor which stores data signals when the data signals are applied to the first TFT TR1.

The structure of the capacitor C depicted in FIG. 6 is just an example, and thus, the present invention is not limited thereto. That is, the first electrode 12 is formed on the same layer as, and of the same material used to form, one of the semiconductor layers 144 and 145, the gate electrodes 124 and 125, and the source and drain electrodes 161 and 162, respectively, of the first TFT TR1 and the second TFT TR2, respectively. The second electrode 14 is formed on the same layer as, and of the same material used to form, one of the semiconductor layers 144 and 145, the gate electrodes 124 and 125, and the source and drain electrodes 161 and 162, respectively, of the first TFT TR1 and the second TFT TR2, respectively, which is not formed with the first electrode 12.

The OLED includes the pixel electrode E1 connected to one of the source and drain electrodes 162 of the second TFT TR2, a counter electrode E2 facing the pixel electrode E1, and a light emitting layer EL disposed between the pixel electrode E1 and the counter electrode E2.

In the organic light emitting display apparatus 100 which includes the capacitor C according the current embodiment, if particles damage the dielectric film 13 in the second portion A12 where the first wire unit 16 is not connected and the second and fourth regions 122 and 142, respectively, of the capacitor C are disposed, damage of the entire capacitor C can be avoided by floating the second and fourth regions 122 and 142, respectively, by cutting the first bridge 123 and the second bridge 143, respectively, or by floating only the second region 122 by cutting the first bridge 123. Therefore, the occurrence of dark spots due to capacitor failure can be prevented, and accordingly, pixel failure of the organic light emitting display apparatus 100 can be reduced.

Also, since the first insulating film 15 and the second insulating film 18 are not disposed on the first bridge 123, but the first opening CNT2 is formed on the first bridge 123, when the first bridge 123 is cut from a lower surface of the substrate 10 using a laser, the cut first bridge 123 is located in the first opening CNT2. When the first insulating film 15 and the second insulating film 18 are formed on the first bridge 123, not only the first insulating film 15 and the second insulating film 18, but also the OLED, may be damaged by the cut first bridge 123. However, in the current embodiment, the first opening CNT2 is disposed on the first bridge 123, and thus, the cut first bridge 123 is located in the first opening CNT2. Therefore, damage to the OLED can be avoided when the first bridge 123 is cut.

As indicated above, since the dielectric film 13, the first insulating film 15, and the second insulating film 18 are not formed on the second bridge 143, but the second opening CNT3 is formed on the second bridge 143, when the second bridge 143 is cut using a laser from the lower surface of the substrate 10, OLED damage which could otherwise occur when the second bridge 143 is cut can be avoided.

Meanwhile, in FIG. 6, the organic light emitting display apparatus 100 is depicted as a display apparatus. However, the present invention is not limited thereto. That is, the display apparatus according to the present invention comprises various display apparatuses including liquid crystal display apparatuses.

Figure 7:
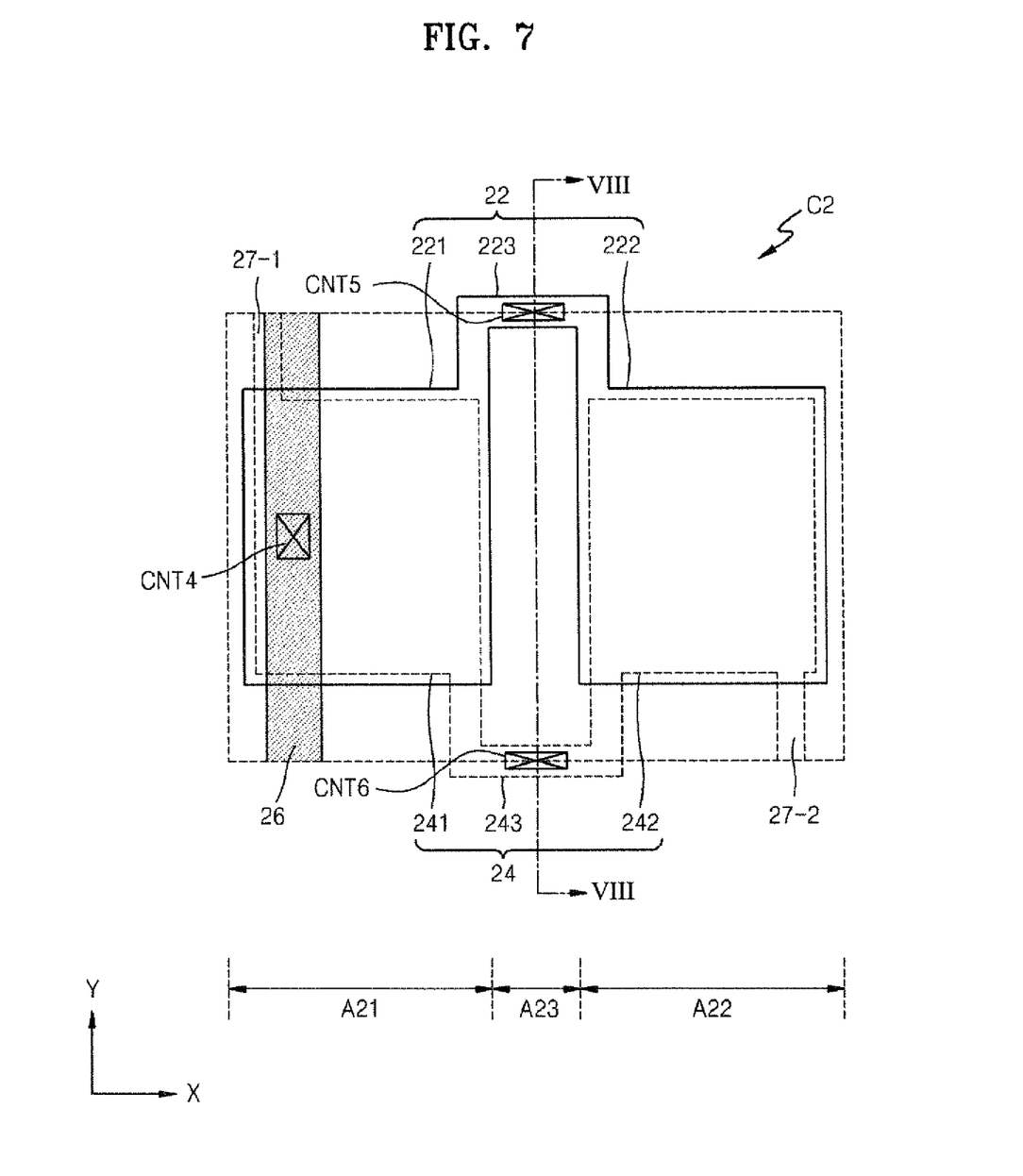
FIG. 7 is a schematic planar view of a capacitor device according to another embodiment of the present invention.
Figure 8:
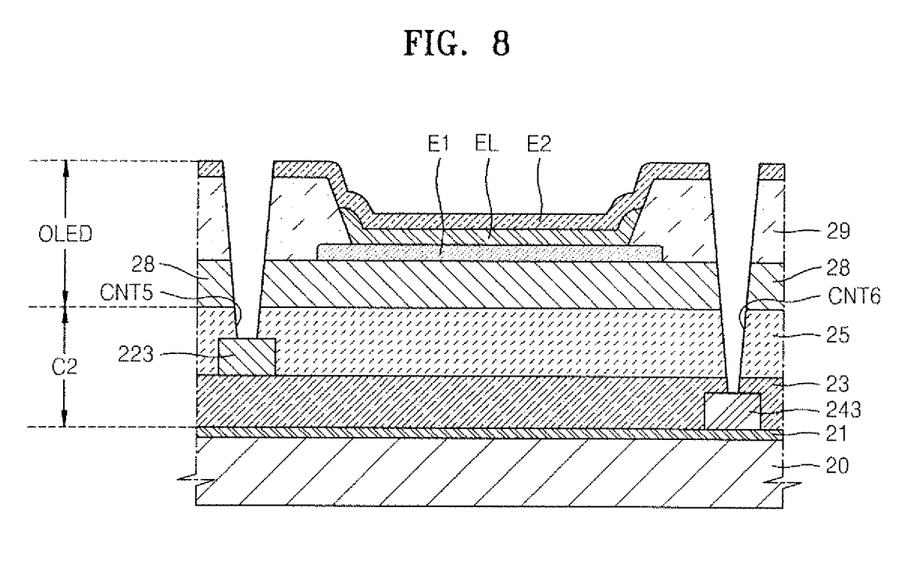
FIG. 8 is a cross-sectional view taken along line VIII-VIII of FIG. 7.

FIG. 7 is a schematic planar view of a capacitor device according to another embodiment of the present invention; and FIG. 8 is a cross-sectional view taken along line VIII-VIII of FIG. 7.

In particular, FIG. 8 is a cross-sectional view showing a structure in which an OLED is disposed on a capacitor device C2.

Referring to FIGS. 7 and 8, the capacitor device C2 according to the current embodiment includes a substrate 20, first and second electrodes 22 and 24, respectively, disposed to face each other on a buffer layer 21, and a dielectric film 23 disposed between the first and second electrodes 22 and 24, respectively.

The first electrode 22, as described above, includes first and second regions 221 and 222, respectively, which are formed on the same layer, and which have an area separated from each other, and a first bridge 223 which is disposed between the first and second regions 221 and 222, respectively, and which electrically connects the first and second regions 221 and 222, respectively.

The second electrode 24, as described above, includes third and fourth regions 241 and 242, respectively, which are formed on the same layer and which are separated from each other, and a second bridge 243 which is disposed between the third and fourth regions 241 and 242, respectively, and which electrically connects the third and fourth regions 241 and 242, respectively. The third and fourth regions 241 and 242, respectively, are disposed so as to correspond to the first and second regions 221 and 222, respectively.

The first bridge 223 and the second bridge 243 are not disposed so as to correspond to each other. That is, as shown in FIG. 7, the second bridge 243 is not disposed so as to correspond to a lower direction of the first bridge 223. As shown in FIG. 7, the first bridge 223 electrically connects the first and second regions 221 and 222, respectively, on an upper edge of the first and second regions 221 and 222, respectively, and the second bridge 243 electrically connects the third and fourth regions 241 and 242, respectively, on a lower edge of the third and fourth regions 241 and 242, respectively. The first bridge 223 and the second bridge 243 may be disposed on an outer region of the OLED.

The first bridge 223 may electrically connect the first and second regions 221 and 222, respectively, by avoiding a region A23 by which the first and second regions 221 and 222, respectively, are separated. That is, the first bridge 223 connects the first and second regions 221 and 222, respectively, by not crossing the region A23 by which the first and second regions 221 and 222, respectively, are separated, but by extending in a direction (Y axis) which crosses a direction (X axis) in which the first and second regions 221 and 222, respectively, are arranged.

The second bridge 243 may electrically connect the third and fourth regions 241 and 242, respectively, by avoiding the region A23 by which the third and fourth regions 241 and 242, respectively, are separated from each other. That is, the second bridge 243 connects the third and fourth regions 241 and 242, respectively, by not crossing the region A23 by which the third and fourth regions 241 and 242, respectively, are separated, but by extending in a direction (Y axis) which crosses a direction (X axis) in which the third and fourth regions 241 and 242, respectively, are arranged.

A portion of the first bridge 223 is exposed through a first opening CNT4, and a portion of the second bridge 243 is exposed through a second opening CNT5. In particular, as shown in FIG. 8, the first opening CNT4 may be formed in a first insulating film 25, a second insulating film 28, and a pixel defining film 29 so as to expose the first bridge 223.

A first wire unit 26 is connected to the first electrode 22, and second wire units 27-1 and 27-2 are connected to the second electrode 24. The first wire unit 26 is formed on the insulating film 25, is connected to the first region 221 of the first electrode 22 through a second contact hole CNT2, and is disposed at a location overlapping the first region 221.

If particles damage a second portion A22 of the dielectric film 23 where the second region 222, to which the first wire unit 26 is not connected, is located, the damage of the entire capacitor device C2 can be avoided by floating the second region 222 by cutting the first bridge 223. That is, although an overall area is reduced, the function of the capacitor can be maintained with a first portion A21 where the first region 221 and the second electrode 24 corresponding to the first region 221 are located, thereby preventing damage of the entire capacitor device C2. Also, since a complicated bridge is not formed in the second electrode 24, the degree of freedom when designing the device can be increased.

Also, since the first insulating film 25 and the second insulating film 28 are not formed on the first bridge 223 but the first opening CNT5 is formed on the first bridge 223, when the first bridge 223 is cut from a lower surface of the substrate 20 using a laser, the cut first bridge 223 is located in the first opening CNT5. When the first insulating film 25 and the second insulating film 28 are formed on the first bridge 223, not only the first insulating film 25 and the second insulating film 28, but also the OLED, may be damaged by the cut first bridge 223. However, in the current embodiment, the first opening CNT5 is disposed on the first bridge 223, and thus, the cut first bridge 223 is located in the first opening CNT5. Therefore, OLED damage which could otherwise occur when the first bridge 223 is cut can be avoided.

Thus, since the dielectric film 23, the first insulating film 25, and the second insulating film 28 are not formed on the second bridge 243, and the second opening CNT6 is formed on the second bridge 243, when the second bridge 243 is cut using a laser from the lower surface of the substrate 20, the cut second bridge 243 is located in the second opening CNT6. Therefore, OLED damage which can otherwise occur when the second bridge 243 is cut can be avoided.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. A capacitor device, comprising:
a first electrode including a first region and a second region, each having an area separated from each other, and a first bridge which is disposed between the first region and the second region, and which electrically connects the first region and the second region;
a second electrode including a third region and a fourth region, each having an area separated from each other, and a second bridge which is disposed between the third region and the fourth region, and which electrically connects the third region and the fourth region;

a dielectric film formed between the first electrode and the second electrode;
a first insulating film covering the first electrode;
a first opening formed in the first insulating film so as to open the first bridge; and
a second opening formed in the first insulating film and the dielectric film so as to open the second bridge.

2. The capacitor device of claim 1, wherein the third region and the fourth region are disposed in regions corresponding to the first region and the second region, respectively.

3. The capacitor device of claim 1, wherein the first bridge is not formed so as to correspond to the second bridge.

4. The capacitor device of claim 1, wherein the first bridge connects the first region and the second region by crossing a region by means of which the first region and the second region are separated.

5. The capacitor device of claim 4, wherein the first bridge is formed in a same layer as the first region and the second region.

6. The capacitor device of claim 1, wherein the second bridge connects the third region and the fourth region by crossing a region by means of which the third region and the fourth region are separated.

7. The capacitor device of claim 6, wherein the second bridge is formed on a same layer as the third region and the fourth region.

8. The capacitor device of claim 1, wherein the first bridge connects the first region and the second region by avoiding a region by means of which the first region and the second region are separated.

9. The capacitor device of claim 1, wherein the second bridge connects the third region and the fourth region by avoiding a region by means of which the third region and the fourth region are separated.

10. A display apparatus, comprising:
at least one thin film transistor (TFT), a capacitor, and a light emitting device;
wherein the TFT comprises a semiconductor layer, a gate electrode, and source and drain electrodes;
wherein the capacitor comprises:
  a first electrode including a first region and a second region, each having an area separated from each other, and a first bridge disposed between the first region and the second region, and which electrically connects the first region and the second region;
  a first wire unit connected to the first electrode;
  a second electrode including a third region and a fourth region, each having an area separated from each other;
  a second bridge disposed between the third region and the fourth region, and which electrically connects the third region and the fourth region;
  a second wire unit connected to the second electrode;
  a dielectric film formed between the first electrode and the second electrode; and
  a first insulating film covering the first electrode;
wherein the light emitting device comprises a pixel electrode connected to one of the source and drain electrodes, a facing electrode facing the pixel electrode, and a light emitting layer disposed between the pixel electrode and the facing electrode;
wherein the light emitting device is disposed on the capacitor so as to correspond to the capacitor; and
wherein the capacitor further comprises a first opening in the first insulating film so as to expose the first bridge, and a second opening in the first insulating film and the dielectric film so as to expose the second bridge.

11. The display apparatus of claim 10, wherein:
the first electrode is formed on a same layer as, and of a same material used to form, one of the semiconductor layer, the gate electrode, and the source and drain electrodes; and
the second electrode is formed on a same layer as, and of a same material used to form, one of the semiconductor layer, the gate electrode, and the source and drain electrodes which is not formed with the first electrode.

12. The display apparatus of claim 10, wherein the first wire unit is connected to a power voltage supply line of the display apparatus, and the second wire unit is connected to one of the source and drain electrodes of the TFT.

13. The display apparatus of claim 12, wherein the first wire unit is connected to one of the first region and the second region, and the power voltage supply line is disposed so as to overlap one of the first region and the second region.

14. The display apparatus of claim 10, wherein the third region and the fourth region are disposed in regions corresponding to the first region and the second region, respectively.

15. The display apparatus of claim 10, wherein the first bridge and the second bridge are not disposed so as to correspond to each other.

16. The display apparatus of claim 10, wherein the first bridge connects the first region and the second region by crossing a region by means of which the first region and the second region are separated.

17. The display apparatus of claim 16, wherein the first bridge is formed on a same layer as the first region and the second region.

18. The display apparatus of claim 10, wherein the second bridge connects the third region and the fourth region by crossing a region by means of which the third region and the fourth region are separated.

19. The display apparatus of claim 18, wherein the second bridge is formed on a same layer as the third region and the fourth region.

20. The display apparatus of claim 10, wherein the first bridge connects the first region and the second region by avoiding a region by means of which the first region and the second region are separated.

21. The display apparatus of claim 20, wherein the second bridge connects the third region and the fourth region by avoiding a region by which the third region and the fourth region are separated.

* * * * *